United States Patent
Pitt et al.

(10) Patent No.: US 10,521,977 B2
(45) Date of Patent: Dec. 31, 2019

(54) METHODS AND SYSTEMS FOR INTEGRATED VEHICLE SENSOR CALIBRATION AND MAINTENANCE

(71) Applicant: GM GLOBAL TECHNOLOGY OPERATIONS LLC, Detroit, MI (US)

(72) Inventors: Evan M. Pitt, Grosse Pointe, MI (US); James N. Nickolaou, Clarkston, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 249 days.

(21) Appl. No.: 15/469,914

(22) Filed: Mar. 27, 2017

(65) Prior Publication Data

US 2018/0276910 A1    Sep. 27, 2018

(51) Int. Cl.
*G07C 5/08*      (2006.01)
*G01B 11/14*     (2006.01)
(Continued)

(52) U.S. Cl.
CPC ........... *G07C 5/08* (2013.01); *G01B 11/14* (2013.01); *G01M 17/007* (2013.01); *G01R 31/006* (2013.01); *G01S 7/003* (2013.01); *G01S 7/40* (2013.01); *G01S 7/497* (2013.01); *G01S 7/52004* (2013.01); *G01S 17/66* (2013.01); *G01S 17/88* (2013.01);
(Continued)

(58) Field of Classification Search
CPC ... G01B 11/14; G01M 17/007; G01R 31/006; G01S 17/66; G01S 17/88; G01S 2013/9353; G01S 2013/936; G01S 7/003; G01S 7/40; G01S 7/497; G01S 7/52004; G07C 5/008; G07C 5/08; Y02P 90/02; G01P 21/02; G01P 21/00; G01C 25/005; G01C 31/006; G01C 19/5719; G01C 19/56; G01C 19/5607; G01C 25/00; F02D 41/22; F02D 41/1495; F02D 41/1454; F02D 41/1494; F02D 41/222; F02D 2200/0406; B60T 8/885; B60T 2270/413; B60T 17/02; B60T 1/10; B60R 21/015; G05B 2219/2637; B60G 17/01908; B60K 15/05; B60W 2520/105; B60W 2720/106
USPC .................. 73/1.37, 114.61, 114.73, 504.12; 701/33.1, 30.5–30.9
See application file for complete search history.

(56) References Cited

U.S. PATENT DOCUMENTS 4,692,697 A * 9/1987 Bray ................. G01R 35/005
                                              324/202
4,719,932 A * 1/1988 Burton .................. B60S 3/04
                                              134/123

(Continued)

*Primary Examiner* — John Fitzgerald
*Assistant Examiner* — Truong D Phan
(74) *Attorney, Agent, or Firm* — Quinn IP Law (57) ABSTRACT

A method of verifying the health and functionality of at least one vehicle sensor is disclosed herein. The method includes positioning the vehicle within a controlled environment test facility, displaying a predetermined test pattern to the at least one vehicle sensor as the vehicle travels within the controlled environment test facility, receiving sensor data corresponding to a performance condition of the at least one sensor from the at least one vehicle sensor, transmitting the sensor data to a remote processor, and determining a functional condition of the at least one vehicle sensor based on the sensor data.

13 Claims, 4 Drawing Sheets

(51) Int. Cl.
*G01M 17/00* (2006.01)
*G01R 31/00* (2006.01)
*G01S 17/66* (2006.01)
*G01S 17/88* (2006.01)
*G01S 7/00* (2006.01)
*G01S 7/497* (2006.01)
*G01S 7/40* (2006.01)
*G01S 7/52* (2006.01)
*G01M 17/007* (2006.01)
*G01S 13/93* (2006.01)
*G07C 5/00* (2006.01)

(52) U.S. Cl.
CPC . *G01S 2013/936* (2013.01); *G01S 2013/9353* (2013.01); *G07C 5/008* (2013.01); *Y02P 90/02* (2015.11)

(56) References Cited

U.S. PATENT DOCUMENTS

| | | | | |
|---|---|---|---|---|
| 7,016,462 | B1* | 3/2006 | Keville | G01N 23/223 378/45 |
| 8,365,580 | B2* | 2/2013 | Stumpf | G01M 17/007 73/40.5 A |
| 8,380,397 | B2* | 2/2013 | Foster | G01D 5/34776 180/402 |
| 9,240,082 | B2* | 1/2016 | Marathe | G08G 1/096716 |
| 9,424,606 | B2* | 8/2016 | Wilson, II | G06Q 40/08 |
| 9,604,563 | B1* | 3/2017 | Wilson, II | G06Q 40/08 |
| 10,166,994 | B1* | 1/2019 | Fields | B60W 50/045 |
| 2006/0025897 | A1* | 2/2006 | Shostak | B60C 23/005 701/1 |
| 2006/0102408 | A1* | 5/2006 | Suita | G01M 11/067 180/233 |
| 2006/0288577 | A1* | 12/2006 | Bormuth | B23P 19/069 29/894 |
| 2007/0109138 | A1* | 5/2007 | Farrell | G01M 3/24 340/605 |
| 2010/0070091 | A1* | 3/2010 | Watson | G06Q 50/06 700/278 |
| 2010/0206341 | A1* | 8/2010 | Essenburg | B60S 3/00 134/45 |
| 2010/0324778 | A1* | 12/2010 | Foster | G01D 5/34776 701/29.2 |
| 2011/0153090 | A1* | 6/2011 | Besore | G05B 15/02 700/278 |
| 2012/0308437 | A1* | 12/2012 | Zhou | G01N 21/03 422/82.05 |
| 2013/0239992 | A1* | 9/2013 | Detrick | F15B 15/2876 134/18 |
| 2013/0335570 | A1* | 12/2013 | Corley | H04N 17/002 348/148 |
| 2014/0052329 | A1* | 2/2014 | Amirpour | G07C 5/0808 701/29.6 |
| 2014/0273877 | A1* | 9/2014 | Corson | H04W 24/06 455/67.13 |
| 2014/0306826 | A1* | 10/2014 | Ricci | H04W 4/21 340/573.1 |
| 2014/0309852 | A1* | 10/2014 | Ricci | H04W 4/21 701/34.4 |
| 2015/0095666 | A1* | 4/2015 | Ananthakrishnan | G06F 1/3212 713/300 |
| 2015/0253125 | A1* | 9/2015 | Pettersson | G01B 11/007 715/771 |
| 2016/0065306 | A1* | 3/2016 | Huang | H04B 10/116 398/118 |
| 2017/0148102 | A1* | 5/2017 | Franke | G06Q 10/20 |
| 2017/0185078 | A1* | 6/2017 | Weast | G05B 23/0297 |
| 2017/0186247 | A1* | 6/2017 | Thorley | G07C 5/006 |
| 2017/0291640 | A1* | 10/2017 | Fujita | B62D 5/0409 |
| 2017/0307469 | A1* | 10/2017 | Kang | H04N 17/002 |
| 2018/0036758 | A1* | 2/2018 | Jittu | B05B 12/16 |
| 2018/0108189 | A1* | 4/2018 | Park | G07C 5/008 |
| 2018/0232964 | A1* | 8/2018 | Chen | G07C 5/008 |

* cited by examiner

METHODS AND SYSTEMS FOR INTEGRATED VEHICLE SENSOR CALIBRATION AND MAINTENANCE

INTRODUCTION

The present invention relates generally to the field of vehicles and, more specifically, to methods and systems for integrating vehicle sensor calibration and maintenance tasks.

Many vehicles are equipped with autonomous and/or semi-autonomous driving systems, applications, and/or features. Autonomous and semi-autonomous driving systems may provide automated driving controls that reduce the driver action required for operating the vehicle.

Vehicle dealerships often perform vehicle calibration and maintenance tasks on customer vehicles, including autonomous or semi-autonomous vehicles. Vehicle calibration may require a technician to take a vehicle on a test drive or perform a number of independent calibration tasks on the vehicle as the vehicle occupies a service bay. Performing vehicle calibration or simple maintenance tasks on a vehicle in a service bay removes the availability of the service bay for another use, such as a more complicated vehicle repair. This can lead to longer service times and reduced customer satisfaction.

SUMMARY

Vehicle dealerships often include a car wash after performing maintenance or repair tasks. Dealership car wash facilities often include mechanized conveyers for moving vehicles through the different stations of the car wash. For simple calibration tasks such as testing and verification of cameras, RADAR, LIDAR, and other vehicle sensors, a car wash can be modified as discussed below to conduct these operations.

A vehicle car wash places the vehicle in a dynamic environment that can be used to test, for example, sensor functionality. In some embodiments, components of the car wash could be modified to include robotic arms, wireless communication areas, and specified vehicle testing platforms to evaluate the performance of vehicle sensors, perform sensor calibration, or perform minor maintenance tasks.

Embodiments according to the present disclosure provide a number of advantages. For example, embodiments according to the present disclosure enable testing, evaluation, and repair of autonomous, semi-autonomous, or other sensor-equipped vehicles as part of a car wash equipped with testing and calibration equipment. Embodiments according to the present disclosure may thus provide streamlined sensor calibration and vehicle maintenance, increasing customer satisfaction.

In one aspect, a method of verifying health and functionality of at least one vehicle sensor of a vehicle having a controller includes the steps of positioning the vehicle within a controlled environment test facility, displaying a predetermined test pattern to the at least one vehicle sensor as the vehicle travels within the controlled environment test facility, receiving, by the controller, sensor data corresponding to a performance condition of the at least one sensor from the at least one vehicle sensor, transmitting, by the controller, the sensor data to a remote processor, and determining, by the controller, a functional condition of the at least one vehicle sensor based on the sensor data.

In some aspects, the method further includes conveying the vehicle along a dedicated path within the controlled test facility.

In some aspects, the method further includes initializing a sensor test procedure by one or more of receiving, by the controller, a control signal triggered by an error code generated by the at least one vehicle sensor, receiving, by the controller, a control signal triggered by a scheduled sensor maintenance interval, and receiving, by the controller, a control signal from a remote operator In some aspects, the method further includes initializing a sensor test procedure by positioning the vehicle within the controlled environment test facility.

In some aspects, the method further includes receiving, by the controller, a list of sensor calibration tests and preparing, by the controller, a test sequence for the at least one vehicle sensor.

In some aspects, the method further includes transmitting, by a control system, a set of control signals to at least one movable arm and at least one programmable display of the test facility based on the prepared test sequence.

In some aspects, determining the functional condition of the at least one vehicle sensor based on the sensor data comprises comparing the sensor data with historical sensor data.

In another aspect, a system to verify health and functionality of at least one vehicle sensor includes a test system including at least one test display, a vehicle conveying system, and a control system in communication with the test system, the vehicle conveying system, and the at least one vehicle sensor. The control system includes a controller configured to receive test procedure data corresponding to a specified test procedure, generate one or more control signals based on the test procedure data, and transmit the one or more control signals to the test system.

In some aspects, the at least one test display is a programmable electronic vision board.

In some aspects, the vehicle conveying system includes a first track and a second track parallel to the first track.

In some aspects, the test system further includes at least one movable arm.

In some aspects, the test system further includes a first movable arm located on one side of the vehicle conveying system and a second movable arm located on the other side of the vehicle conveying system.

In some aspects, a first test display is coupled to an end of the first movable arm and a second test display is coupled to an end of the second movable arm.

In some aspects, the controller is further configured to transmit one or more control signals to one or more of the first and second movable arms and one or more of the first and second test displays.

In some aspects, the test system further includes a first side-oriented testing system and a second side-oriented testing system, the first side-oriented testing system including a first test display and the second side-oriented testing system including a second test display, wherein the first and second test displays are static displays.

In some aspects, the controller is further configured to initialize a sensor test procedure by one or more of receiving, by the controller, a control signal from a remote operator.

In yet another aspect, an autonomous vehicle includes a vehicle body, at least one vehicle sensor coupled to the vehicle body, and a controller in communication with the at least one vehicle sensor. The controller is configured to position the vehicle within a controlled environment test facility, generate instructions to direct the vehicle along a dedicated path within the controlled test facility, receive sensor control instructions corresponding to a sensor test procedure, transmit, to the at least one vehicle sensor, a control signal to control the at least one vehicle sensor according to the sensor control instructions, receive, from the at least one vehicle sensor, sensor data corresponding to a performance condition of the at least one sensor, and determine a functional condition of the at least one vehicle sensor.

In some aspects, the controller is further configured to transmit the sensor data to a remote processor.

In some aspects, the controller is further configured to operate the autonomous vehicle in a reduced capacity mode based on the functional condition of the at least one vehicle sensor.

In some aspects, the functional condition indicates one of a sensor failure or a sensor malfunction that would impair autonomous control of the vehicle.

The above advantages and other advantages and features of the present disclosure will be apparent from the following detailed description of exemplary embodiments when taken in connection with the accompanying drawings.

BRIEF DESCRIPTION OF THE DRAWINGS

The present disclosure will be described in conjunction with the following figures, wherein like numerals denote like elements.

The foregoing and other features of the present disclosure will become more fully apparent from the following description and appended claims, taken in conjunction with the accompanying drawings. Understanding that these drawings depict only several embodiments in accordance with the disclosure and are not to be considered limiting of its scope, the disclosure will be described with additional specificity and detail through the use of the accompanying drawings. Any dimensions disclosed in the drawings or elsewhere herein are for the purpose of illustration only.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Certain terminology may be used in the following description for the purpose of reference only, and thus are not intended to be limiting. For example, terms such as "above" and "below" refer to directions in the drawings to which reference is made. Terms such as "front," "back," "left," "right," "rear," and "side" describe the orientation and/or location of portions of the components or elements within a consistent but arbitrary frame of reference which is made clear by reference to the text and the associated drawings describing the components or elements under discussion. Moreover, terms such as "first," "second," "third," and so on may be used to describe separate components. Such terminology may include the words specifically mentioned above, derivatives thereof, and words of similar import.

Figure 1:
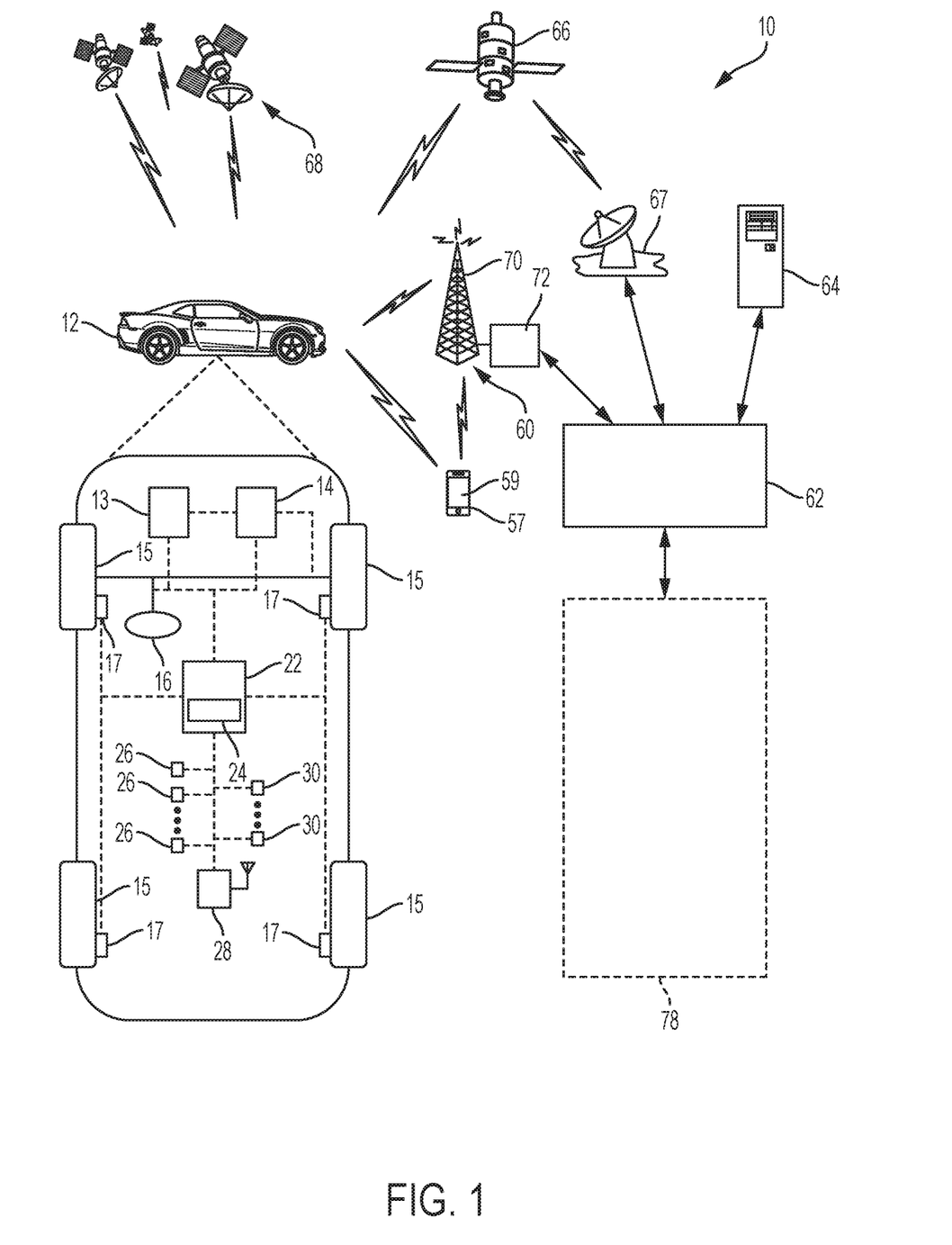
FIG. 1 is a schematic diagram of a communication system including an autonomously controlled vehicle, according to an embodiment.

FIG. 1 schematically illustrates an operating environment that includes a mobile vehicle communication and control system 10 for a motor vehicle 12. The communication and control system 10 for the vehicle 12 generally includes one or more wireless carrier systems 60, a land communications network 62, a computer 64, a networked wireless device such as a smart phone 57, and a remote access center 78.

The vehicle 12, shown schematically in FIG. 1, includes a propulsion system 13, which may in various embodiments include an internal combustion engine, an electric machine such as a traction motor, and/or a fuel cell propulsion system. Vehicle 12 is depicted in the illustrated embodiment as a passenger car, but it should be appreciated that any other vehicle including motorcycles, trucks, sport utility vehicles (SUVs), recreational vehicles (RVs), marine vessels, aircraft, etc., can also be used.

The vehicle 12 also includes a transmission 14 configured to transmit power from the propulsion system 13 to a plurality of vehicle wheels 15 according to selectable speed ratios. According to various embodiments, the transmission 14 may include a step-ratio automatic transmission, a continuously-variable transmission, or other appropriate transmission. The vehicle 12 additionally includes wheel brakes 17 configured to provide braking torque to the vehicle wheels 15. The wheel brakes 17 may, in various embodiments, include friction brakes, a regenerative braking system such as an electric machine, and/or other appropriate braking systems.

The vehicle 12 additionally includes a steering system 16. While depicted as including a steering wheel and steering column for illustrative purposes, in some embodiments, the steering system 16 may not include a steering wheel. In various embodiments, the steering system 16 further includes various other column based or rack based features (not depicted in FIG. 1), such as, but not limited to, a steering gear, intermediate connecting shafts between the column and the gear, connection joints, either flexible or rigid, allowing desired articulation angles between the intermediate connecting shafts, and tie-rods. The steering gear, in turn, may comprise a rack, an input shaft, and an internal gearing.

The vehicle 12 includes a wireless communications system 28 configured to wirelessly communicate with other vehicles ("V2V") and/or infrastructure ("V2I"). In an exemplary embodiment, the wireless communication system 28 is configured to communicate via a dedicated short-range communications (DSRC) channel. DSRC channels refer to one-way or two-way short-range to medium-range wireless communication channels specifically designed for automotive use and a corresponding set of protocols and standards. However, additional or alternate wireless communications standards, such as IEEE 802.11 and cellular data communication, are also considered within the scope of the present disclosure.

The propulsion system 13, transmission 14, steering system 16, and wheel brakes 17 are in communication with or under the control of at least one controller 22. While depicted as a single unit for illustrative purposes, the controller 22 may additionally include one or more other controllers, collectively referred to as a "controller." The controller 22 may include a microprocessor or central processing unit (CPU) in communication with various types of computer readable storage devices or media. Computer readable storage devices or media may include volatile and nonvolatile storage in read-only memory (ROM), random-access memory (RAM), and keep-alive memory (KAM), for example. KAM is a persistent or non-volatile memory that may be used to store various operating variables while the CPU is powered down. Computer-readable storage devices or media may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the controller 22 in controlling the vehicle.

The controller 22 includes an automated driving system (ADS) 24 for automatically controlling various actuators in the vehicle. In an exemplary embodiment, the ADS 24 is a so-called Level Four or Level Five automation system. A Level Four system indicates "high automation", referring to the driving mode-specific performance by an automated driving system of all aspects of the dynamic driving task, even if a human driver does not respond appropriately to a request to intervene. A Level Five system indicates "full automation", referring to the full-time performance by an automated driving system of all aspects of the dynamic driving task under all roadway and environmental conditions that can be managed by a human driver. In an exemplary embodiment, the ADS 24 is configured to control the propulsion system 13, transmission 14, steering system 16, and wheel brakes 17 to control vehicle acceleration, steering, and braking, respectively, without human intervention via a plurality of actuators 30 in response to inputs from a plurality of sensors 26, which may include GPS, RADAR, LIDAR, optical cameras, thermal cameras, ultrasonic sensors, and/or additional sensors as appropriate.

FIG. 1 illustrates several networked devices that can communicate with the wireless communication system 28 of the vehicle 12. One of the networked devices that can communicate with the vehicle 12 via the wireless communication system 28 is the smart phone 57. The smart phone 57 can include computer processing capability, a transceiver capable of communicating using a short-range wireless protocol, and a visual smart phone display 59. The computer processing capability includes a microprocessor in the form of a programmable device that includes one or more instructions stored in an internal memory structure and applied to receive binary input to create binary output. In some embodiments, the smart phone 57 includes a GPS module capable of receiving GPS satellite signals and generating GPS coordinates based on those signals. In other embodiments, the smart phone 57 includes cellular communications functionality such that the smart phone 57 carries out voice and/or data communications over the wireless carrier system 60 using one or more cellular communications protocols, as are discussed herein. The visual smart phone display 59 may also include a touch-screen graphical user interface.

The wireless carrier system 60 is preferably a cellular telephone system that includes a plurality of cell towers 70 (only one shown), one or more mobile switching centers (MSCs) 72, as well as any other networking components required to connect the wireless carrier system 60 with the land communications network 62. Each cell tower 70 includes sending and receiving antennas and a base station, with the base stations from different cell towers being connected to the MSC 72 either directly or via intermediary equipment such as a base station controller. The wireless carrier system 60 can implement any suitable communications technology, including for example, analog technologies such as AMPS, or digital technologies such as CDMA (e.g., CDMA2000) or GSM/GPRS. Other cell tower/base station/MSC arrangements are possible and could be used with the wireless carrier system 60. For example, the base station and cell tower could be co-located at the same site or they could be remotely located from one another, each base station could be responsible for a single cell tower or a single base station could service various cell towers, or various base stations could be coupled to a single MSC, to name but a few of the possible arrangements.

Apart from using the wireless carrier system 60, a second wireless carrier system in the form of satellite communication can be used to provide uni-directional or bi-directional communication with the vehicle 12. This can be done using one or more communication satellites 66 and an uplink transmitting station 67. Uni-directional communication can include, for example, satellite radio services, wherein programming content (news, music, etc.) is received by the transmitting station 67, packaged for upload, and then sent to the satellite 66, which broadcasts the programming to subscribers. Bi-directional communication can include, for example, satellite telephony services using the satellite 66 to relay telephone communications between the vehicle 12 and the station 67. The satellite telephony can be utilized either in addition to or in lieu of the wireless carrier system 60.

The land network 62 may be a conventional land-based telecommunications network connected to one or more landline telephones and connects the wireless carrier system 60 to the remote access center 78. For example, the land network 62 may include a public switched telephone network (PSTN) such as that used to provide hardwired telephony, packet-switched data communications, and the Internet infrastructure. One or more segments of the land network 62 could be implemented through the use of a standard wired network, a fiber or other optical network, a cable network, power lines, other wireless networks such as wireless local area networks (WLANs), or networks providing broadband wireless access (BWA), or any combination thereof. Furthermore, the remote access center 78 need not be connected via land network 62, but could include wireless telephony equipment so that it can communicate directly with a wireless network, such as the wireless carrier system 60.

While shown in FIG. 1 as a single device, the computer 64 may include a number of computers accessible via a private or public network such as the Internet. Each computer 64 can be used for one or more purposes. In an exemplary embodiment, the computer 64 may be configured as a web server accessible by the vehicle 12 via the wireless communication system 28 and the wireless carrier 60. Other computers 64 can include, for example: a service center computer where diagnostic information and other vehicle data can be uploaded from the vehicle via the wireless communication system 28 or a third party repository to or from which vehicle data or other information is provided, whether by communicating with the vehicle 12, the remote access center 78, the smart phone 57, or some combination of these. The computer 64 can maintain a searchable database and database management system that permits entry, removal, and modification of data as well as the receipt of requests to locate data within the database. The computer 64 can also be used for providing Internet connectivity such as DNS services or as a network address server that uses DHCP or other suitable protocol to assign an IP address to the vehicle 12.

The remote access center 78 is designed to provide the wireless communication system 28 of the vehicle 12 with a number of different system functions, such as storage of account information, storage and management of vehicle diagnostic information via one or more networked databases, and processing of sensor data received from the vehicle 12. The databases can store account information such as subscriber authentication information, vehicle identifiers, profile records, behavioral patterns, and other pertinent subscriber information. Data transmissions may also be conducted by wireless systems, such as 802.11x, GPRS, and the like. The processor of the remote access center can receive sensor data from the vehicle 12 and analyze the sensor data, including comparing the sensor data to historical stored sensor data or predetermined sensor performance data, for example and without limitation. The remote access center 78 can utilize an automated advisor or a live advisor to provide instructions or other information to the vehicle via the wireless communication system 28.

As discussed herein, the vehicle 12 includes a variety of sensors 26 that provide information to assist with control of the vehicle 12. The sensors 26 include, in some embodiments, one or more GPS, RADAR, LIDAR, optical cameras, thermal cameras, ultrasonic sensors, and/or additional sensors as appropriate. As the vehicle is operated, the sensors may need periodic inspections and calibration to ensure operation within prescribed tolerances.

Figure 2:
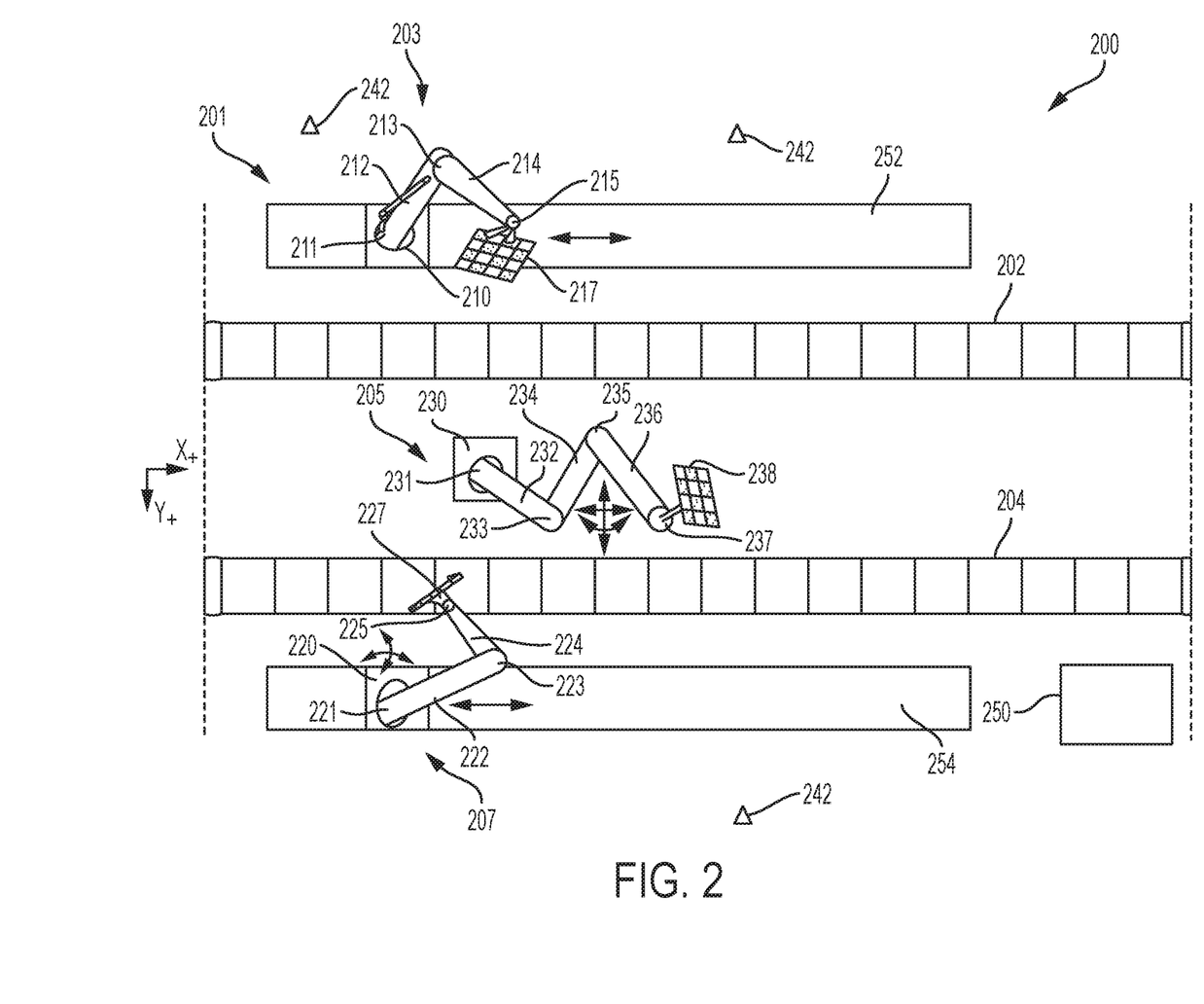
FIG. 2 is a schematic diagram of a test facility, according to an embodiment.

A conveyor system in an established facility, such as a car wash, includes, according to exemplary embodiments, a testing and calibration area to test vehicle sensors, including optical cameras, thermal cameras, ultrasonic sensors, RADAR, LIDAR, and/or additional sensors. With reference to FIG. 2, a calibration and test area 200 within a car wash facility is illustrated, according to an exemplary embodiment. The calibration and test area 200 is, in some exemplary embodiments, part of a vehicle car wash facility. The area 200 allows automated testing and calibration of vehicle sensors, such as one or more of the sensors 26 of the vehicle 12. The area 200 includes two parallel vehicle conveyance tracks 202, 204 defining a dedicated path within the test facility. In some embodiments, the conveyance tracks 202, 204 are conveyor belts similar to those found in a vehicle car wash. The area 200 also includes a testing and calibration system 201. The system 201 includes a plurality of movable arms 203, 205, 207. As discussed in greater detail herein, the arms 203, 205, 207 include a plurality of arm segments rotatably connected together such that a predetermined test pattern, such as a programmable electronic vision board, may be displayed to one or more of the sensors 26 of the vehicle 12 for testing and calibration of one or more of the sensors 26.

In some embodiments, the arm 203 is positioned on a platform 210 located on a track 252 on the left, or outer, side of the track 202. For example, if the vehicle 12 enters the test facility 200 from the left side of FIG. 2 and progresses towards the right side of FIG. 2, the arm 203 is positioned on the left side of the vehicle 12. In some embodiments, the platform 210 moves along the track 252 from left to right as illustrated in FIG. 2. In some embodiments, the platform 210 includes wheels, tracks, or treads such that the platform 210 can move along the track 252 or is otherwise conveyed along the track 252 by any means conceivable to those skilled in the art. In some embodiments, the platform 210 moves from left to right at the same rate as the conveyance tracks 202, 204 move the vehicle 12 from left to right. The moving platform 210 allows the arm 203 to be positioned along the length of the vehicle 12 to best test and evaluate one of the sensors 26 located on the left side of the vehicle 12.

The arm 203 includes, in some embodiments, two arm segments 212, 214 as shown in FIG. 2. In other embodiments, the arm 203 includes more or fewer arm segments. The arm segments 212, 214 are connected at a pinned connection or joint 213 and the arm 203 is rotatably connected to the platform 210 at a pinned connection or movable joint 211. A display 217 is attached to one end of the arm segment 214 at the end of the arm 203 at a movable joint or pinned connection 215. In some embodiments, the display 217 is a programmable electronic display configured to electronically display a predetermined test pattern such as, for example and without limitation, a check-patterned vision board, to one or more of the sensors 26 of the vehicle 12. In some embodiments, the display 217 is a static display or vision board. In some embodiments, the arm 203 rotates or bends at any of the connections 211, 213, 215 to best orient the display 217 to test one or more of the sensors 26.

In some embodiments, the arm 205 is positioned between the tracks 202, 204. The arm 205 is connected to a platform 230 located generally between the tracks 202, 204. In some embodiments, the platform 230 is a movable platform located on a track running parallel to the tracks 202, 204 so that the arm 205 can move from left to right or right to left to orient a test display to test sensors 26 located on the front and/or rear of the vehicle 12. In some embodiments, the platform 230 is a stationary platform.

The arm 205 includes a plurality of arm segments 232, 234, 236. In some embodiments, the arm 205 includes three arm segments as shown. In other embodiments, the arm 205 includes more or fewer arm segments. The arm segments 232, 234 are connected at a pinned connection or joint 233, the arm segments 234, 236 are connected at a pinned connection or joint 235, and the arm 205 is rotatably connected to the platform 230 at a pinned connection or movable joint 231. A display 238 is attached to one end of the arm segment 236 at the end of the arm 205 at a movable joint or pinned connection 237. In some embodiments, the display 238 is a programmable electronic display configured to electronically display a test pattern such as, for example and without limitation, a check-patterned vision board, to one or more of the sensors 26 of the vehicle 12. In some embodiments, the display 238 is a static display or vision board. In some embodiments, the arm 205 rotates or bends at any of the connections 231, 233, 235, 237 to best orient the display 238 to test one or more of the sensors 26.

On the opposite side of the tracks 202, 204 (and thus on the right side of the vehicle 12 as it progresses from left to right in FIG. 2), is the movable arm 207. In some embodiments, the arm 207 is positioned on a platform 220 located on a track 254 on the right, or outer, side of the track 204. For example, if the vehicle 12 enters the test facility 200 from the left side of FIG. 2 and progresses towards the right side of FIG. 2, the arm 207 is positioned on the right side of the vehicle 12. In some embodiments, the platform 220 moves along the track 254 from left to right as illustrated in FIG. 2. In some embodiments, the platform 220 includes wheels, tracks, or treads such that the platform 220 can move along the track 254 or is otherwise conveyed along the track 254 by any means known to those skilled in the art. In some embodiments, the platform 220 moves from left to right at the same rate as the conveyance tracks 202, 204 move the vehicle 12 from left to right. The moving platform 220 allows the arm 207 to be positioned along the length of the vehicle 12 to best test and evaluate one of the sensors 26 located on the right side of the vehicle 12.

The arm 207 includes, in some embodiments, two arm segments 222, 224 as shown in FIG. 2. In other embodiments, the arm 207 includes more or fewer arm segments. The arm segments 222, 224 are connected at a pinned connection or joint 223 and the arm 207 is connected to the platform 220 at a pinned connection or movable joint 221. A display 227 is attached to one end of the arm segment 224 at the end of the arm 207 at a movable joint or pinned connection 225. In some embodiments, the display 227 is a programmable electronic display configured to electronically display a test pattern such as, for example and without limitation, a check-patterned vision board, to one or more of the sensors 26 of the vehicle 12. In some embodiments, the display 227 is a static display or vision board. In some embodiments, the arm 207 rotates or bends at any of the connections 221, 223, 225 to best orient the display 227 to test one or more of the sensors 26.

The test patterns displayed by the displays 217, 227, 238 are configurable depending on the type of testing or calibration to be performed on one or more of the sensors 26. For example and without limitation, in some embodiments one or more of the displays 217, 227, 238 is programmed to display a checked pattern such as a vision board. A checked or checkerboard pattern may be used to test and calibrate one or more cameras or other sensors 26 on the vehicle 12. The known pattern and size of the light and dark marks on the display are used to calibrate the sensors 26 to account for sensor drift or other errors. The displays 217, 227, 238 can be positioned, by the arms 203, 205, 207, into various positions with respect to the vehicle 12 such that the position of the displays 217, 227, 238 are optimized for testing and calibration of one or more of the sensors 26.

In some embodiments, the arms 203, 205, 207 are robotic arms that may be controlled by control signals received from the vehicle 12 via controller 22 and the communication system 28. In some embodiments, the arms 203, 205, 207 are controlled remotely via signals received, via a wireless or wired connection, from the remote access center 78 based on the sensors 26 to be tested and the test to be performed at the test area 200. In some embodiments, the control signals for the arms 203, 205, 207 are received from a control system 250 located at the test area 200. The control system 250 contains at least one processor or controller and a communication system to communicate via a wired or wireless connection with the vehicle 12 and/or the remote access center 78. Additionally, in some embodiments, after one or more tests or calibration sequences are complete, the data measured by one or more of the sensors 26 is transmitted, wirelessly or via a wired connection, to a remote data center, such as the remote access center 78, for analysis.

Additionally, in some embodiments, the test facility 200 includes one or more reflectors 242. In some embodiments, the reflectors 242 are placed towards the front and rear corners of the test facility 200. The reflectors 242 provide a known, fixed point of reflection that can be used to test and calibrate one or more RADAR sensors of the sensors 26.

In some embodiments, as the vehicle 12 enters the test area 200, communication between the controller 22 of the vehicle 12, the remote access center 78, and/or the control system 250 of the test area 200 establish the test sequence to be performed. The selected test sequence may be based on vehicle identification (VIN), vehicle mileage, or sensor error codes logged by the controller 22, as discussed in greater detail below. Based on the selected test sequence, in some embodiments, the control system 250 activates and deactivates the arms 203, 205, 207 and the displays 217, 227, 238. In some embodiments, activation of the arms 203, 205, 207 and the displays 217, 227, 238, is based on detection of the location of the vehicle 12 along the tracks 202, 204. In some embodiments, activation of the sensors 26 is based on the location of the vehicle 12 along the tracks 202, 204, the selected test sequence, or the sensors 26 are activated to simulate normal operation of the vehicle 12 (that is, when the vehicle 12 is traveling along a road or highway under normal operating conditions).

Figure 3:
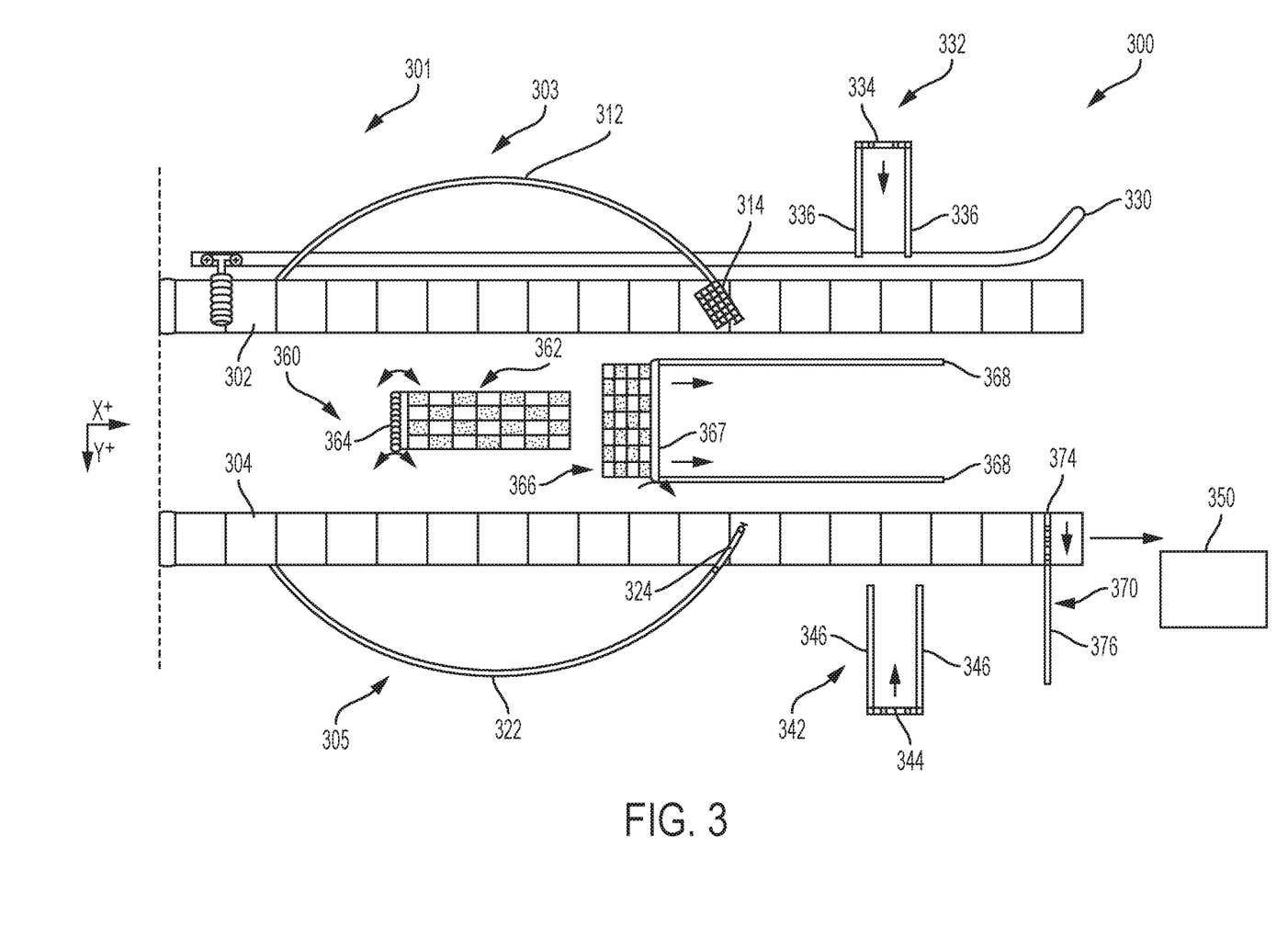
FIG. 3 is a schematic diagram of a test facility, according to another embodiment.

FIG. 3 illustrates a second embodiment of a calibration and test area. In some embodiments, the calibration and test area is part of a car wash facility. The area 300 allows automated testing and calibration of vehicle sensors, such as one or more of the sensors 26 of the vehicle 12. In some embodiments, the area 300 is an enclosed space through which a vehicle can travel from left to right in FIG. 3, such as, for example and without limitation, a vehicle car wash. The area 300 includes two parallel vehicle conveyance tracks 302, 304. In some embodiments, the conveyance tracks 302, 304 are conveyor belts similar to those found in a vehicle car wash. In some embodiments, the area 300 includes one or more tire catching arms 330 (one shown), used to guide the vehicle 12 onto the conveyance tracks 302, 304. The area 300 also includes a testing and calibration system 301.

In some embodiments, the system 301 includes one or more suspended side display systems. Two suspended display systems 303, 305 are shown in FIG. 3. However, in other embodiments, the system 301 could include more or fewer suspended display systems. Each of the suspended display systems 303, 305 includes a track 312, 322. The tracks 312, 322 are, in some embodiments, attached to a ceiling of the facility housing the area 300. In some embodiments, the tracks 312, 322 are curved as shown in FIG. 3. However, in other embodiments, the tracks 312, 322 may be straight or incorporate one or more angled turns. The tracks 312, 322 allow a test surface, such as a display 314, 324, to travel along the track attached to the ceiling such that the displays may be displayed to one or more of the sensors 26 of the vehicle 12. Similar to the displays 217, 227, 238 discussed above, in some embodiments, the displays 314, 324 are programmable electronic displays configured to electronically display one or more test patterns or vision boards, such as a checked pattern, depending on the specific test or calibration being performed on the sensors 26 of the vehicle 12. In some embodiments, the displays 314, 324 are static displays or vision boards. The displays 314, 324 can be positioned along the tracks 312, 322 into various positions with respect to the vehicle 12 such that the position of the displays 314, 324 are optimized for testing and calibration of one or more of the sensors 26, such as one or more side mounted cameras. In some embodiments, the control signals for the displays 314, 324 are received from a control system 350 located at the test facility 300. The control system 350 contains at least one processor or controller and a communication system to communicate via a wired or wireless connection with the vehicle 12 and/or the remote access center 78.

With continued reference to FIG. 3, in some embodiments, the system 301 includes two side-oriented testing systems 332, 342 configured to test side-mounted sensors 26 on the vehicle 12. The side-oriented testing systems 332, 342 include support members 336, 346. The support members 336, 346 support side test displays 334, 344 that may be either static displays or electronically programmable displays. In some embodiments, the side test displays 334, 344 are oriented substantially parallel to the sides of the vehicle 12 as it passes through the test system 301. The side test displays 334, 344 are, in some embodiments, patterned, such as with a checked pattern, for visual identification by one or more side-mounted sensors of the vehicle 12. In some embodiments, the side test displays 334, 344 travel vertically up and down the support members 336, 346 and/or rotate up and down depending on the height and configuration of the vehicle 12, to better orient the displays 334, 344 relative to the side-mounted sensors 26 of the vehicle 12.

In some embodiments, the system 301 also includes a front and rear array test system 360. The front and rear array test system 360 includes a front test display 362 and a rear test display 366. In some embodiments, the displays 362, 366 are programmable electronic displays configured to electronic display one or more test patterns or vision boards, such as a checked pattern, depending on the specific test or calibration being performed on the sensors 26 of the vehicle 12. In some embodiments, the displays 362, 366 are static displays or vision boards. In some embodiments, the front test display 362 is oriented such that the longest dimension of the display 362 is aligned with a longitudinal dimension of the vehicle 12. In other words, the longest dimension of the display 362 is substantially parallel to the direction of travel of the vehicle 12 as the vehicle moves through the area 300. The front test display 362 is pivotably mounted to the floor of the test facility 300 at a transverse member 364. The front test display 362 pivots about an axis defined by the transverse member 364 from a first orientation to a second or testing orientation in which the front test display 362 is oriented substantially perpendicular to the floor of the area 300.

In some embodiments, as the vehicle 12 moves through the test area 300, the front test display 362 receives a signal from the control system 350 or from a location sensor that detects the location of the vehicle 12 within the area 300 and pivots about the axis defined by the transverse member 364 to orient the test display 362 towards one or more front-mounted sensors 26 of the vehicle 12. In some embodiments, the front test display 362 pivots back toward the floor (that is, from the testing orientation to the first orientation) once the sensor test is complete such that the vehicle 12 can travel over the front test display 362 and continue to progress through the test area 300. The front test display 362 can also be used to test under-mounted sensors 26 if the vehicle 12 includes under-mounted sensors 26.

The rear test display 366 is mounted to a transverse member 367. The rear test display 366 pivots about an axis defined by the transverse member 367 from a first orientation to a second or testing orientation in which the rear test display 366 is oriented substantially perpendicular to the floor of the area 300. In some embodiments, the ends of the transverse member 367 are mounted on two substantially parallel tracks 368. The tracks 368 are mounted to the floor of the area 300 and are substantially parallel to the direction of movement of the vehicle 12 as it passes through the test area 300. In some embodiments, the transverse member 367 travels along the two substantially parallel tracks 368 mounted to the floor of the test area 300. In some embodiments, the rear test display 366 rotates upward to the testing position when the transverse member 367 is located at any point along the length of the tracks 368 to orient the rear test display 366 to test one or more rear-mounted sensors 26 of the vehicle 12.

In some embodiments, as the vehicle 12 moves through the test area 300, the rear test display 366 receives a signal from the control system 350 indicating a desired test for one or more rear-mounted sensors 26 and the rear test display 366 pivots about the axis defined by the transverse member 367 to orient the test display 366 towards one or more rear-mounted sensors 26 of the vehicle 12. In some embodiments, the display 366 rotates to the testing orientation from the first orientation in response to a signal indicating the location of the vehicle 12 within the area 300. In some embodiments, the rear test display 366 pivots back toward the floor (that is, from the testing orientation to the first orientation) once the sensor test is complete such that the vehicle 12 can travel over the rear test display 366 and continue to progress through the test area 300. As the vehicle 12 passes over the rear test display 266, the display 366 can be used to test under-mounted sensors 26 if the vehicle 12 includes under-mounted sensors 26.

In some embodiments, the system 301 also includes a road hazard simulation test display system 370. The road hazard simulation test display system 370 simulates a road hazard appearing in front of the vehicle 12 to test and analyze the performance of one or more of the sensors 26. The system 370 includes a display 374 mounted on a track 376. Similar to the displays 362, 366, the display 374 can be either an electronic programmable display or a static display. After receiving a trigger signal, such as, for example and without limitation, a signal from the control system 350 or a signal from a location sensor located in the area 300 indicating the location of the vehicle 12, the display 374 moves toward the track 304 to a position in front of the vehicle 12. In some embodiments, the display 374 moves along the track 376 from a first orientation away from the path of the vehicle 12 to a second or testing orientation substantially in front of at least a portion of the vehicle 12 in response to a control signal received either wirelessly or via a wired connection. The display 374 can retract from the testing orientation to the first orientation to allow the vehicle 12 to continue to progress through the test area 300.

As discussed above, as the vehicle 12 is conveyed along the tracks 302, 304 through the test area 300, the front and rear test displays 362, 366 pivot such that the displays 362, 366 face one of the front and rear surfaces of the vehicle 12. For example, and without limitation, as the vehicle 12 passes through the test system 301 from left to right as shown in FIG. 3, initially the front test display 362 pivots up and is displayed to the vehicle 12. Sensors 26 mounted on the front of the vehicle 12, such as, for example and without limitation, RADAR, LIDAR, and optical cameras, may be tested and calibrated depending on the configuration of the test display 362. As the vehicle 12 continues to the travel from left to right, the front test display 362 pivots down such that the vehicle 12 passes over the front display 362. Once the vehicle 12 reaches a specified point along the tracks 302, 304, the rear test display 366 pivots along the axis defined by the transverse member 367 and is displayed to the rear section of the vehicle 12. Sensors 26 mounted on the rear of the vehicle 12, such as, for example and without limitation, RADAR, LIDAR, and optical cameras, may be tested and calibrated depending on the configuration of the test display 366. In some embodiments, the rear test display 366 travels along the parallel tracks 368 depending on the length of the vehicle 12 such that the distance between the display 366 and the rear of the vehicle 12 may be adjusted depending on the type of sensor calibration to be performed.

In some embodiments, as the vehicle 12 enters the test area 300, communication between the controller 22 of the vehicle 12, the remote access center 78, and/or the control system 350 of the test area 300 establish the test sequence to be performed. The selected test sequence may be based on vehicle identification (VIN), vehicle mileage, or sensor error codes logged by the controller 22, as discussed in greater detail below. Based on the selected test sequence, in some embodiments, the control system 350 activates and deactivates the displays 314, 324, 334, 344, 364, 366. In some embodiments, activation of the displays 314, 324, 334, 344, 364, 366, is based on detection of the location of the vehicle 12 along the tracks 302, 304. In some embodiments, activation of the sensors 26 is based on the location of the vehicle 12 along the tracks 302, 304, the selected test sequence, or the sensors 26 are activated to simulate normal operation of the vehicle 12 (that is, when the vehicle 12 is traveling along a road or highway under normal operating conditions).

Figure 4:
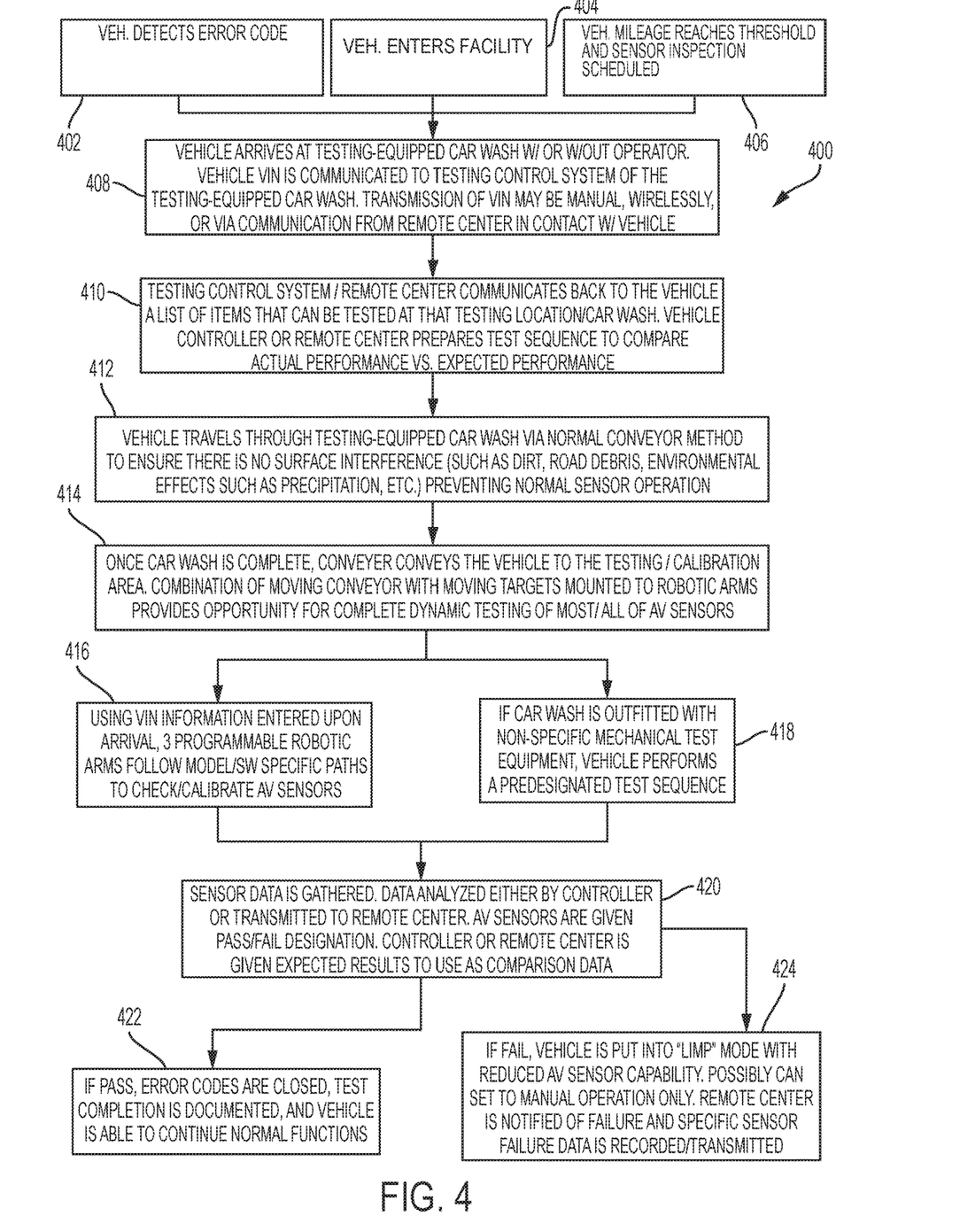
FIG. 4 is a flow chart of a method to test vehicle sensors in a test facility, such as the test facilities shown in FIGS. 2 and 3.

FIG. 4 illustrates a flow chart of a method 400 to test and calibrate one or more vehicle sensors within a controlled test environment. The method 400 may be performed at one of the test facilities 200, 300 and by one of the test systems 201, 301 discussed above with respect to FIGS. 2 and 3. The method 400 can be utilized in connection with the vehicle 12, which may be an autonomous or semi-autonomous vehicle or may be any vehicle equipped with one or more sensors 26, and the test systems 201, 301, in accordance with exemplary embodiments. As can be appreciated in light of the disclosure, the order of operation within the method 400 is not limited to the sequential execution as illustrated in FIG. 4, but may be performed in one or more varying orders as applicable and in accordance with the present disclosure.

The sensor test procedure illustrated by method 400 is initiated by any one of the initialization steps 402, 404, or 406, which include initialization by receipt of a control signal triggered by an error code or a scheduled maintenance interval or by operator intent. At 402, the controller 22 of the vehicle 12 detects an error code from one or more of the sensors 26. The vehicle 12 is instructed by the ADS 24 of the controller 22 to perform an inspection or test to verify the function of one or more of the sensors 26 and the vehicle 12 is instructed to drive to a test facility, such as a facility including one of the test areas 200, 300. Initialization of one or more sensors tests may also occur by positioning the vehicle within the controlled environment test facility, such as, for example and without limitation, entering a car wash as indicated at 404, wherein the operator of the vehicle 12 requests a car wash of the vehicle 12 for cosmetic purposes and the vehicle 12 is driven to or is instructed to drive to a car wash facility equipped with one of the test systems 201, 301 discussed above. At 406, the mileage of the vehicle 12 has reached a predetermined threshold and the vehicle 12 is scheduled to perform an inspection of one or more of the sensors 26. In response to any one of the three trigger conditions 402, 404, 406, the vehicle 12 is instructed to proceed to one of the test areas 200, 300 by the ADS 24 or by a control signal received from the remote access center 78. The method 400 proceeds to 408.

At 408, the vehicle 12 arrives at the test facility, which, in some embodiments, is a car wash facility equipped with one of the test systems 201, 301. The vehicle 12 includes one or more sensors 26 and may be operator-controlled or may be an autonomous or semi-autonomous vehicle as discussed above. The vehicle 12 enters the test facility with or without the operator. The vehicle identification number (VIN) of the vehicle 12 is communicated to the testing control system, such as systems 250, 350, of the test facility by either the controller 22 via the communication system 28 or by the remote access center 78.

Next, at 410, the test facility control system 250, 350 sends, via wired or wireless communication, a list of tests or calibration tasks that can be performed at the facility. The vehicle controller 22 or the remote access center 78 prepares a test sequence to compare the actual performance of one or more of the sensors 26 with the expected performance of the one or more sensors 26 based on a predetermined sensor calibration.

The method 400 proceeds to 412, and the vehicle 12 progresses through the facility equipped with one of the test systems 201, 301. As discussed above, in exemplary embodiments the vehicle 12 travels through a car wash via a conveyor method to reduce surface interference from the outer surface of the vehicle 12 such as dirt and road debris that may impact normal operation of one or more of the sensors 26. Additionally, as discussed above, the test facility limits the effect of environmental factors such as precipitation, etc. on normal operation of and the testing and calibration of one or more of the sensors 26.

After the vehicle 12 has passed through the car wash at 412 to reduce or remove dirt and debris from the sensors 26, the conveyor method conveys the vehicle 12 to the testing/calibration area, such as one of areas 201, 301, as shown at 414. As discussed above, the combination of a vehicle conveyor method with adjustable displays or targets mounted to programmable and movable arms provides an opportunity for dynamic testing of many of the sensors 26 of the vehicle 12 within a controlled environment.

From 414, the method 400 proceeds to either of steps 416, or 418. At 416, if the vehicle 12 is located at a test facility that includes the test system 201, using the VIN information received upon the vehicle's arrival to the test facility, the testing control system 250 communicates the test sequence to and controls the plurality of movable arms 203, 205, 207. The control system 250 directs the movable arms 203, 205, 207 to follow a specified pattern or path to test and calibrate one or more of the vehicle sensors 26 based on, for example and without limitation, error codes transmitted to the controller 22 and/or the remote access center 78 or a test/calibration sequence based on mileage or time of operation of the vehicle 12.

At 418, if the test facility is not equipped with programmable and movable arms and instead is a facility equipped with the test system 301, the vehicle 12 proceeds through the test area 300 and the controller 22 receives data from one or more of the sensors 26 based on a predetermined test sequence.

From either 416 or 418, the method 400 proceeds to 420. At 420, the data gathered from the sensors 26 during the test sequences is received by the controller 22 for on-board analysis or the sensor data is transmitted via the communication system 28 to the remote access center 78 for further analysis. Analysis of the data by either the controller 22 or the remote access center 78 leads to a performance condition or functional condition analysis including, in some embodiments, a pass/fail designation for one or more of the sensors 26. The analysis of the data includes comparing the sensor data to historical sensor data or to predetermined expected sensor performance thresholds, for example and without limitation.

If the sensor data indicates that the sensors 26 are operating within predetermined expected parameters, the method 400 proceeds to 422. At 422, any error codes received by the controller 22 from one or more of the sensors 26 are closed. Completion of the test sequence is recorded by the controller 22 and/or the remote access center 78 and the vehicle 12 continues normal operation. The method 400 then ends.

If the sensor data indicates that one or more of the sensors 26 fails to operate within the designated tolerances, the method 400 proceeds to 424. At 424, the vehicle 12 is instructed, by either the controller 22 or by the remote access center 78, to operate in a reduced sensor capacity or "limp" mode. In some embodiments, if the sensor data indicates a sensor failure or malfunction that would impair autonomous control of the vehicle 12, the vehicle 12 is instructed to operate in manual mode. The remote access center 78 receives the sensor data and/or any analytical information generated by the controller 22 related to the unexpected sensor performance for further analysis. The method 400 then ends.

In some embodiments, the data is analyzed within the vehicle controller 22. In other embodiments, the data is transmitted by the communication system 28 to the remote access center 78 for analysis and comparison with expected or historical sensor data.

It should be emphasized that many variations and modifications may be made to the herein-described embodiments, the elements of which are to be understood as being among other acceptable examples. All such modifications and variations are intended to be included herein within the scope of this disclosure and protected by the following claims. Moreover, any of the steps described herein can be performed simultaneously or in an order different from the steps as ordered herein. Moreover, as should be apparent, the features and attributes of the specific embodiments disclosed herein may be combined in different ways to form additional embodiments, all of which fall within the scope of the present disclosure.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Moreover, the following terminology may have been used herein. The singular forms "a," "an," and "the" include plural referents unless the context clearly dictates otherwise. Thus, for example, reference to an item includes reference to one or more items. The term "ones" refers to one, two, or more, and generally applies to the selection of some or all of a quantity. The term "plurality" refers to two or more of an item. The term "about" or "approximately" means that quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art. The term "substantially" means that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Numerical data may be expressed or presented herein in a range format. It is to be understood that such a range format is used merely for convenience and brevity and thus should be interpreted flexibly to include not only the numerical values explicitly recited as the limits of the range, but also interpreted to include all of the individual numerical values or sub-ranges encompassed within that range as if each numerical value and sub-range is explicitly recited. As an illustration, a numerical range of "about 1 to 5" should be interpreted to include not only the explicitly recited values of about 1 to about 5, but should also be interpreted to also include individual values and sub-ranges within the indicated range. Thus, included in this numerical range are individual values such as 2, 3 and 4 and sub-ranges such as "about 1 to about 3," "about 2 to about 4" and "about 3 to about 5," "1 to 3," "2 to 4," "3 to 5," etc. This same principle applies to ranges reciting only one numerical value (e.g., "greater than about 1") and should apply regardless of the breadth of the range or the characteristics being described. A plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items. The term "alternatively" refers to selection of one of two or more alternatives, and is not intended to limit the selection to only those listed alternatives or to only one of the listed alternatives at a time, unless the context clearly indicates otherwise.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components. Such example devices may be on-board as part of a vehicle computing system or be located off-board and conduct remote communication with devices on one or more vehicles.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further exemplary aspects of the present disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A method of evaluating at least one vehicle sensor of a vehicle having a controller, the method comprising:
    positioning the vehicle within a controlled environment test facility;
    receiving, by the controller, a list of sensor calibration tests and preparing, by the controller, a test sequence for the at least one vehicle sensor;
    transmitting, by a control system, a set of control signals to at least one movable arm and at least one programmable display of the test facility based on the prepared test sequence;
    displaying a predetermined test pattern to the at least one vehicle sensor as the vehicle travels within the controlled environment test facility;
    receiving, by the controller, sensor data from the at least one vehicle sensor corresponding to a performance condition of the at least one vehicle sensor based on a response by the at least one vehicle sensor to the predetermined test pattern;
    transmitting, by the controller, the sensor data to a remote processor; and
    determining, by the controller, a functional condition of the at least one vehicle sensor based on the sensor data.

2. The method of claim 1 further comprising conveying the vehicle along a dedicated path within the controlled test facility.

3. The method of claim 1 further comprising initializing a sensor test procedure by one or more of receiving, by the controller, a control signal triggered by an error code generated by the at least one vehicle sensor, receiving, by the controller, a control signal triggered by a scheduled sensor maintenance interval, and receiving, by the controller, a control signal from a remote operator.

4. The method of claim 1 further comprising initializing a sensor test procedure by positioning the vehicle within the controlled environment test facility.

5. The method of claim 1, wherein determining the functional condition of the at least one vehicle sensor based on the sensor data comprises comparing the sensor data with historical sensor data.

6. A system to evaluate at least one vehicle sensor, comprising:
    a test system including at least one movable arm and at least one test display configured to display a predetermined test pattern to the at least one vehicle sensor;
    a vehicle conveying system;
    a control system in communication with the test system, the vehicle conveying system, and the at least one vehicle sensor, the control system comprising a controller configured to
        receive a list of sensor calibration tests and prepare a test sequence for the at least one vehicle sensor;
        generate one or more control signals based on the prepared test sequence; and
        transmit the one or more control signals to the at least one movable arm and at least one test display of the test system based on the prepared test sequence.

7. The system of claim 6, wherein the at least one test display is a programmable electronic vision board.

8. The system of claim 6, wherein the controller is further configured to initialize a sensor test procedure by one or more of receiving, by the controller, a control signal from a remote operator.

9. The system of claim 6, wherein the vehicle conveying system comprises a first track and a second track parallel to the first track.

10. The system of claim 9, wherein the test system further comprises a first side-oriented testing system and a second side-oriented testing system, the first side-oriented testing system comprising a first test display and the second side-oriented testing system comprising a second test display, wherein the first and second test displays are static displays.

11. The system of claim 6, wherein the test system further comprises a first movable arm located on one side of the vehicle conveying system and a second movable arm located on the other side of the vehicle conveying system.

12. The system of claim 11, wherein a first test display is coupled to an end of the first movable arm and a second test display is coupled to an end of the second movable arm.

13. The system of claim 12, wherein the controller is further configured to transmit one or more control signals to one or more of the first and second movable arms and one or more of the first and second test displays.

* * * * *